United States Patent
Drasal et al.

(10) Patent No.: US 11,650,110 B2
(45) Date of Patent: May 16, 2023

(54) ROSETTE PIEZO-RESISTIVE GAUGE CIRCUIT FOR THERMALLY COMPENSATED MEASUREMENT OF FULL STRESS TENSOR

(71) Applicant: Honeywell International Inc., Charlotte, NC (US)

(72) Inventors: Zbynek Drasal, Prague (CZ); Jan Pekarek, Brno (CZ); Mikulas Jandak, Vienna (AT)

(73) Assignee: Honeywell International Inc., Charlotte, NC (US)

( * ) Notice: Subject to any disclaimer, the term of this patent is extended or adjusted under 35 U.S.C. 154(b) by 171 days.

(21) Appl. No.: 17/089,421

(22) Filed: Nov. 4, 2020

(65) Prior Publication Data
US 2022/0136913 A1    May 5, 2022

(51) Int. Cl.
*G01L 5/162*    (2020.01)
*B81B 7/02*    (2006.01)
*G01L 1/18*    (2006.01)

(52) U.S. Cl.
CPC .......... *G01L 1/18* (2013.01); *B81B 7/02* (2013.01); *G01L 5/162* (2013.01); *B81B 2201/0264* (2013.01)

(58) Field of Classification Search
CPC ......... G01L 9/065; G01L 9/0052–0055; G01L 5/162; G01L 1/205; G01L 1/2293; G01L 1/2291; G01L 1/18; B81B 3/0021
See application file for complete search history.

(56) References Cited

U.S. PATENT DOCUMENTS 3,913,391 A * 10/1975 Kurtz ................. G01L 1/18
4,065,971 A *  1/1978 Shimazoe .......... G01L 9/0054
                                                  73/727

(Continued)

FOREIGN PATENT DOCUMENTS

| CN | 103941041 A | 7/2014 |
| CN | 107246910 A | 10/2017 |
| GB |   2521163 A |  6/2015 |

OTHER PUBLICATIONS

Great Britain Intellectual Property Office, "Patents Act 1977: Search Report under Section 17(5)", GB Application No. GB2112127.2, From Foreign Counterpart to U.S. Appl. No. 17/089,421, dated Feb. 22, 2022, pp. 1 through 4, Published: GB.

(Continued)

*Primary Examiner* — Tran M. Tran
(74) *Attorney, Agent, or Firm* — Fogg & Powers LLC

(57) ABSTRACT

Techniques relating to a micro-electro-mechanical (MEMS) device configured to measure direct axial and shear stress components of a stress tensor are described. The MEMS device includes a first and second circuit configured in a double rosette structure coupled with a third circuit in a standard rosette structure to form a triple rosette piezo-resistive gauge circuit. The first circuit includes at least one piezoresistive element suspended from a substrate, and at least one piezoresistive element fixed to the substrate. The second circuit includes each piezoresistive element fixed to the substrate. The third circuit includes at least one piezoresistive element fixed to the substrate. Additionally, the MEMS device may be coupled to one or more processing systems to determine a mechanical stress tensor that is applied to the MEMS device based on measurements received from the MEMS device.

19 Claims, 7 Drawing Sheets

(56) References Cited

U.S. PATENT DOCUMENTS

| | | | | |
|---|---|---|---|---|
| 4,530,244 A * | 7/1985 | Starr | G01L 9/065 | 338/42 |
| 4,672,411 A * | 6/1987 | Shimizu | G01L 9/0054 | 257/419 |
| 4,683,755 A * | 8/1987 | Samek | G01L 1/2293 | 73/777 |
| 4,777,826 A * | 10/1988 | Rud, Jr | G01L 9/045 | 338/195 |
| 4,884,051 A * | 11/1989 | Takahashi | G01L 1/18 | 338/4 |
| 4,993,266 A * | 2/1991 | Omura | G01L 1/18 | 73/754 |
| 5,259,248 A * | 11/1993 | Ugai | G01L 9/0054 | 374/143 |
| 5,329,271 A * | 7/1994 | Inuzuka | G01P 15/123 | 338/42 |
| 5,537,882 A * | 7/1996 | Ugai | G01L 9/0054 | 338/42 |
| 6,234,027 B1 * | 5/2001 | Schatz | G01L 9/0055 | 73/754 |
| 6,279,402 B1 * | 8/2001 | Fisher | C23C 16/52 | 73/754 |
| 6,289,738 B1 * | 9/2001 | Zabler | B60T 8/171 | 73/726 |
| 6,444,487 B1 * | 9/2002 | Boggs | G01L 9/0055 | 438/459 |
| 6,718,830 B1 * | 4/2004 | Johnson | G01L 9/065 | 73/754 |
| 6,789,431 B2 * | 9/2004 | Ishio | G01L 9/0054 | 73/754 |
| 6,838,303 B2 * | 1/2005 | Wang | G01L 9/0054 | 438/54 |
| 6,973,836 B2 * | 12/2005 | Katsumata | G01L 9/065 | 73/715 |
| 7,192,819 B1 * | 3/2007 | Padmanabhan | G01L 9/0042 | 438/460 |
| 7,278,319 B2 * | 10/2007 | Johnson | G01L 9/065 | 73/727 |
| 7,302,856 B2 * | 12/2007 | Tang | G01N 33/54373 | 73/777 |
| 7,311,009 B2 * | 12/2007 | Kotovsky | G01L 1/18 | 73/777 |
| 7,318,351 B2 * | 1/2008 | Cobianu | G01L 1/2262 | 73/753 |
| 7,430,920 B2 * | 10/2008 | Sumigawa | G01B 7/20 | 73/777 |
| 7,509,866 B2 * | 3/2009 | Krog | G01L 9/0054 | 73/726 |
| 7,530,274 B2 * | 5/2009 | Kurtz | G01M 3/3236 | 73/714 |
| 7,540,198 B2 * | 6/2009 | Ichikawa | G01L 9/0054 | 73/754 |
| 7,633,131 B1 * | 12/2009 | Padmanabhan | B81C 1/00158 | 257/E21.154 |
| 7,694,586 B2 * | 4/2010 | Rey | G01L 1/2262 | 73/862.042 |
| 7,763,947 B2 * | 7/2010 | Zhan | B81B 3/0021 | 257/656 |
| 7,785,912 B2 * | 8/2010 | Zhan | B81B 3/0021 | 257/E21.456 |
| 7,823,456 B2 * | 11/2010 | Krog | G01L 9/0054 | 73/726 |
| 7,934,430 B2 * | 5/2011 | Irving | G01L 1/2262 | 73/795 |
| 7,992,448 B2 * | 8/2011 | Shimazu | G01L 1/2293 | 73/777 |
| 8,042,400 B2 * | 10/2011 | Yoneda | G01L 9/0054 | 73/736 |
| 8,146,440 B2 * | 4/2012 | Lin | G06F 3/0338 | 73/760 |
| 8,161,820 B2 * | 4/2012 | Yoneda | G01L 9/0054 | 73/715 |
| 8,298,293 B2 * | 10/2012 | Leydet | A61F 2/70 | 623/24 |
| 8,314,444 B2 * | 11/2012 | Yokoyama | G01L 9/0055 | 438/117 |
| 8,497,672 B2 | 7/2013 | Kawakubo et al. | | |
| 8,522,619 B2 * | 9/2013 | Tokuda | G01L 9/0054 | 73/736 |
| 8,671,765 B2 * | 3/2014 | Tokuda | G01L 9/0054 | 73/715 |
| 8,695,441 B2 * | 4/2014 | Kim | G01L 1/2293 | 73/862.045 |
| 8,701,460 B2 * | 4/2014 | Krishna | G01L 27/005 | 73/1.59 |
| 8,707,796 B2 * | 4/2014 | Duenas | G01B 7/18 | 73/777 |
| 8,943,897 B2 * | 2/2015 | Beauvais | A61B 5/447 | 73/777 |
| 9,016,125 B2 * | 4/2015 | Andreucci | G01P 15/097 | 73/579 |
| 9,016,135 B2 * | 4/2015 | Huber | G01D 3/0365 | |
| 9,261,423 B2 * | 2/2016 | Benfield | G01L 1/18 | |
| 9,404,820 B2 * | 8/2016 | Gutierrez Lopez | G01L 5/00 | |
| 9,417,142 B2 * | 8/2016 | Ichige | G01L 1/2231 | |
| 9,513,182 B2 * | 12/2016 | Kakoiyama | G01L 9/0052 | |
| 9,528,895 B2 * | 12/2016 | Robert | G01L 9/0019 | |
| 9,638,589 B2 * | 5/2017 | Fiori | G01L 1/20 | |
| 9,689,767 B2 * | 6/2017 | Van Der Wiel | G01L 19/04 | |
| 9,846,204 B2 * | 12/2017 | Huber | G01R 33/0082 | |
| 9,959,004 B2 * | 5/2018 | Lång | G01L 5/0038 | |
| 10,041,848 B2 | 8/2018 | Motta et al. | | |
| 10,215,653 B2 | 2/2019 | Holm et al. | | |
| 10,250,233 B2 * | 4/2019 | Scilla | H01L 23/34 | |
| 10,260,981 B2 * | 4/2019 | Holm | G01L 9/0052 | |
| 10,317,297 B2 | 6/2019 | Van Der Wiel | | |
| 10,352,792 B2 * | 7/2019 | Nurmetov | H01L 27/22 | |
| 10,458,865 B2 * | 10/2019 | Alaca | G01L 1/22 | |
| 10,495,529 B2 * | 12/2019 | Lipowski | G01L 1/246 | |
| 10,536,780 B2 * | 1/2020 | Chen | H01L 41/047 | |
| 10,607,901 B2 * | 3/2020 | Hiblot | H01L 22/32 | |
| 10,816,423 B2 * | 10/2020 | Tokuda | G01L 1/2287 | |
| 10,871,407 B2 * | 12/2020 | Chen | G01L 1/18 | |
| 10,955,304 B2 * | 3/2021 | Ramezani | H01L 21/22 | |
| 11,268,867 B2 * | 3/2022 | Knickerbocker | G01L 1/2293 | |
| 11,309,364 B2 * | 4/2022 | Ma | H01L 51/5253 | |
| 11,379,069 B2 * | 7/2022 | Ma | H01L 27/3272 | |
| 11,415,405 B2 * | 8/2022 | Hong | G01L 1/044 | |
| 2003/0062193 A1 * | 4/2003 | Thaysen | B81B 3/0021 | 174/255 |
| 2003/0089182 A1 * | 5/2003 | Thaysen | B81B 3/0021 | 73/862.621 |
| 2004/0079159 A1 * | 4/2004 | Muchow | G01L 9/06 | 73/716 |
| 2006/0257286 A1 * | 11/2006 | Adams | G01N 29/036 | 422/82.01 |
| 2008/0173960 A1 * | 7/2008 | Kotovsky | G01L 1/18 | 257/419 |
| 2009/0211362 A1 * | 8/2009 | Krog | G01L 9/0054 | 73/716 |
| 2010/0199783 A1 * | 8/2010 | Sakurai | G01P 15/18 | 73/514.33 |
| 2013/0118264 A1 * | 5/2013 | Walter | G01L 9/00 | 73/717 |
| 2013/0139615 A1 * | 6/2013 | Kwom | G01L 5/1627 | 156/196 |
| 2013/0205910 A1 * | 8/2013 | Gharib | G01L 5/162 | 73/777 |
| 2014/0042566 A1 * | 2/2014 | Ota | G01L 1/2293 | 257/417 |
| 2014/0137654 A1 * | 5/2014 | Zwijze | G01L 19/0092 | 73/727 |
| 2015/0114128 A1 * | 4/2015 | Norian | G01L 9/065 | 73/708 |
| 2019/0113411 A1 | 4/2019 | Wong et al. | | |
| 2019/0145773 A1 | 5/2019 | Collin et al. | | |
| 2019/0265034 A1 | 8/2019 | Kabasawa et al. | | |
| 2019/0285663 A1 | 9/2019 | Chino et al. | | |
| 2020/0033825 A1 | 1/2020 | Otani et al. | | |

(56) References Cited

U.S. PATENT DOCUMENTS

| | | | |
|---|---|---|---|
| 2020/0087138 A1 | 3/2020 | Schenk et al. | |
| 2020/0370976 A1* | 11/2020 | Kobayashi | H05K 1/181 |
| 2021/0175410 A1* | 6/2021 | Van Der Wiel | G01L 1/2293 |
| 2021/0214211 A1* | 7/2021 | Shankar | B81B 3/0021 |
| 2021/0293633 A1* | 9/2021 | Li | G01L 1/2262 |
| 2021/0366817 A1* | 11/2021 | Tamari | H01L 21/76898 |
| 2022/0065716 A1* | 3/2022 | Shmilovich | G01B 7/18 |
| 2022/0120633 A1* | 4/2022 | Smerzi | G01L 5/162 |
| 2022/0205853 A1* | 6/2022 | Nohno | G01L 5/228 |

OTHER PUBLICATIONS

Beaty et al., "Evaluation of Piezoresistive Coefficient Variation in Silicon Stress Sensors Using a Four-Point Bending Test Fixture", IEEE Transactions on Components, Hybrids, and Manufacturing Technology, Oct. 1982, pp. 904-914, vol. 15, No. 5, IEEE.

Bittle et al., "Piezoresistive Stress Sensors for Structural Analysis of Electronic Packages", Journal of Electronic Packaging, Sep. 1991, pp. 203-215, vol. 113, ASME.

Bossche et al., "Calibration procedure for piezoresistance coefficients of polysilicon sheets and application to a stress test chip", Sensors and Actuators A 62, 1997, pp. 475-479, Elsevier.

Cho et al., "Characterization of the Temperature Dependence of the Pressure Coefficients of n- and p- Type Silicon Using Hydrostatic Testing", IEEE Sensors Journal, Apr. 2008, pp. 392-400, vol. 8, No. 4, IEEE.

Erskine, "Polycrystalline Silicon-on-Metal Strain Gauge Transducers", IEEE Transactions on Electron Devices, Jul. 1983, pp. 796-801, vol. ED-30, No. 7, IEEE.

French et al., "Piezoresistance in polysilicon and its applications to strain gauges", Solid-State Electronics, 1989, pp. 1 through 10, vol. 32, Pergamon Press plc.

French et al., "Polycrystalline silicon strain sensors", Sensors and Actuators, 8, 1985, pp. 219 through 225, Elsevier Sequoia.

Gridchin et al., "Phenomenological Model of the Piezoresistive Effect in Polysilicon Films", Russian Microelectronics, 2003, pp. 205-213, vol. 32, No. 4, Thin Films: Physics and Technology.

Jaeger et al. "Errors Associated With the Design, Calibration and Application of Piezoresistive Stress Sensors in (100) Silicon", IEEE Transactions on Components, Packaging, and Manufactured Technology—Part B: Advanced Packaging, Feb. 1994, pp. 97-107, vol. 17, No. 1, IEEE.

Jaeger et al., "Off-Axis Sensor Rosettes for Measurement of the Piezoresistive Coefficients of Silicon", IEEE Transactions on Components, Hybrids, and Manufacturing Technology, Dec. 1993, pp. 925-931, vol. 16, No. 8, IEEE.

Kanda, "A Graphical Representation of the Piezoresistance Coefficients in Silicon", IEEE Transactions on Electron Devices, Jan. 1982, pp. 64-70, vol. ED-29, No. 1, IEEE.

Shen et al., "A Novel Piezoresistive Stress Sensing Method in Flip Chip Technology", 11th International Conference on Electronic Packaging Technology & High Density Packaging, 2010, pp. 675-678, IEEE.

Suhling et al., "Design and Calibration of Optimized (111) Silicon Stress Sensing Test Chips", Proceedings of the Pacific Rim/ASME International Intersociety Electronic & Photonic Packaging Conference INTERPack '97, vol. 2, The American Society of Mechanical Engineers.

Suhling et al., "Silicon Piezoresistive Stress Sensors and Their Application in Electronic Packaging", IEEE Sensors Journal, Jun. 2001, pp. 14-30, vol. 1, No. 1, IEEE.

Tatar et al., "Interaction Effects of Temperature and Stress on Matched-Mode Gyroscope Frequencies", Transducers, Jun. 2013, pp. 2527-2530, IEEE.

Tatar et al., "On-Chip Characterization of Stress Effects on Gyroscope Zero Rate Output and Scale Factor", MEMS, Jan. 2015, pp. 813-816, Estoril, Portugal.

Tatar et al., "On-Chip Stress Compensation on the ZRO of a Mode-Matched MEMS Gyroscope", 2016, pp. 1-4, EEE.

Tatar et al., "Simulation of Stress Effects on Mode-Matched MEMS Gyrsoscope Bias and Scale Factor", 2014, pp. 16-20, IEEE.

Tatar et al., "Stress Effects and Compensation of Bias Drift in a MEMS Vibratory-Rate Gyroscope", Journal of Microelectromechanical Systems, Jun. 2017, pp. 569-579, vol. 26, No. 3, IEEE.

Tatar, "On-Chip Compensation of Stress, Temperature, and Nonlinearity in a MEMS Gyroscope", Submitted in partial fulfillment of the requirements for the degree of Doctor of Philosophy in Electrical and Computer Engineering, Feb. 2016, Carnegie Mellon University, Pittsburg, PA.

* cited by examiner

ROSETTE PIEZO-RESISTIVE GAUGE CIRCUIT FOR THERMALLY COMPENSATED MEASUREMENT OF FULL STRESS TENSOR

STATEMENT REGARDING NON-U.S. SPONSORED RESEARCH OR DEVELOPMENT

The MEMS ESO project leading to this application has received funding from the Czech Technology Agency under the Epsilon program, Grant Agreement No. TH03010205.

BACKGROUND

Many vehicle navigation applications use micro-electromechanical systems (MEMS) for a multitude of purposes. For example, MEMS devices, such as gyroscopes and accelerometers, may provide rotation and acceleration information to vehicle navigation applications. Measurements provided by MEMS devices can be used to determine and monitor various navigation parameters of an aircraft during flight.

Still, various environmental conditions may significantly affect the performance of MEMS devices, including MEMS gyroscopes. The effects of these environmental conditions may ultimately result in long-term performance degradation of the MEMS devices. Temperature is one such environmental condition. Since changes in temperature can affect the induced stress level of the gyroscope, vehicle navigation applications may monitor temperature to improve the accuracy of navigation data.

A much less predictable environmental condition, however, is the effect of mechanical stress applied to the MEMS gyroscope. Such bias stress can arise from imperfections inherent to the MEMS gyroscope, for example, due to the manufacturing, processing, or production of the gyroscope. Stress can also be applied external to the gyroscope, such as from other devices or systems coupled or proximate to the gyroscope. Failure to adequately monitor temperature or applied stress risks stability, precision, measurement bias, which ultimately can lead to a shorter gyroscopic life.

SUMMARY

The details of one or more embodiments are set forth in the description below. The features illustrated or described in connection with one exemplary embodiment may be combined with the features of other embodiments. Thus, any of the various embodiments described herein can be combined to provide further embodiments. Aspects of the embodiments can be modified, if necessary to employ concepts of the various patents, applications and publications as identified herein to provide yet further embodiments.

In one embodiment, a device is provided. The device comprises a first circuit comprising a first group and a second group of piezo-resistive elements oriented in a first configuration. The first group and second group comprise at least one piezo-resistive element that is fixed to at least one substrate and at least one piezo-resistive element suspended from the at least one substrate. The device further comprises a second circuit coupled to the first circuit comprising a third and fourth group of piezo-resistive elements oriented in a second configuration. Each piezo-resistive element in the third and fourth group is fixed to the at least one substrate. The device further comprises a third circuit coupled to the first and second circuits. The third circuit comprises a fifth and sixth group of piezo-resistive elements oriented in a third configuration distinct from the first and second configuration. At least one of the piezo-resistive elements in the fifth and sixth groups are fixed to the at least one substrate.

In another embodiment, a system is provided. The system comprises a micro-electro-mechanical systems (MEMS) device. The MEMS device comprises a first circuit comprising a first group and a second group of piezo-resistive elements oriented in a first configuration. The first group and second group comprise at least one piezo-resistive element that is fixed to at least one substrate and at least one piezo-resistive element suspended from the at least one substrate. The MEMS device further comprises a second circuit coupled to the first circuit comprising a third and fourth group of piezo-resistive elements oriented in a second configuration. Each piezo-resistive element in the third and fourth group is fixed to the at least one substrate. The MEMS device further comprises a third circuit coupled to the first and second circuits. The third circuit comprises a fifth and sixth group of piezo-resistive elements oriented in a third configuration distinct from the first and second configuration. At least one of the piezo-resistive elements in the fifth and sixth groups are fixed to the at least one substrate.

In yet another embodiment, a method is provided. The method comprises receiving measurements of mechanical stress from a micro-electro-mechanical device comprising a first, second, and third circuit. The first circuit comprises a first and second group of piezo-resistive elements in a first configuration, wherein the first configuration comprises at least one piezo-resistive element that is fixed to at least one substrate and at least one piezo-resistive element suspended from the at least one substrate. The second circuit comprises a third and fourth group of piezo-resistive elements in a second configuration, wherein the second configuration comprises each piezo-resistive element in the third and fourth group is fixed to the at least one substrate. The third circuit comprises a fifth and sixth group of piezo-resistive elements in a third configuration, wherein the third configuration comprises each of the piezo-resistive elements oriented at an angle different than an angle of the piezo-resistive elements in the first and second configurations, and wherein the third configuration comprises at least one of the piezo-resistive elements in the fifth and sixth groups are fixed to the at least one substrate. The method further comprises determining dimensional components of the mechanical stress based on the received measurements.

BRIEF DESCRIPTION OF THE DRAWINGS

Exemplary features of the present disclosure, its nature and various advantages will be apparent from the accompanying drawings and the following detailed description of various embodiments. Non-limiting and non-exhaustive embodiments are described with reference to the accompanying drawings, wherein like labels or reference numbers refer to like parts throughout the various views unless otherwise specified. The sizes and relative positions of elements in the drawings are not necessarily drawn to scale. For example, the shapes of various elements are selected, enlarged, and positioned to improve drawing legibility. The particular shapes of the elements as drawn have been selected for ease of recognition in the drawings. One or more embodiments are described hereinafter with reference to the accompanying drawings in which.

Figure 1:
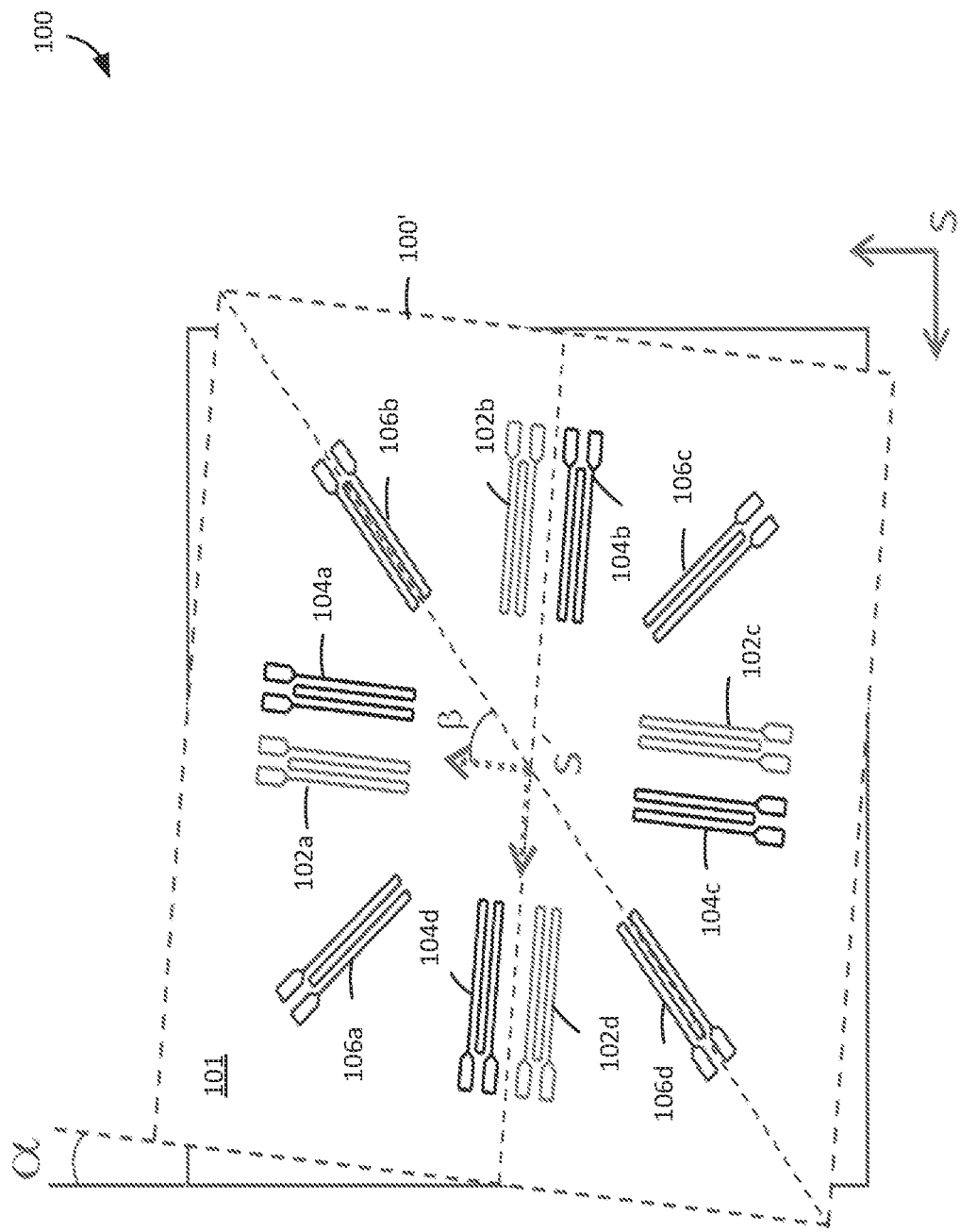
FIG. 1 is a top-level diagram of a piezo-resistive gauge circuit in a triple rosette configuration, according to one or more embodiments described in the present disclosure.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

The following disclosure describes techniques that enable the determination of a stress tensor. Compensating for mechanical stress can be a difficult endeavor because of the difficulty in determining the particular stress tensor that is experienced by MEMS sensors, e.g., gyroscopes. In particular, stress can be applied in both the axial plane (e.g., in the x, y, or z plane) referred to as "axial" stress, as well as in co-axial planes (e.g., in the xy, xz, or yz plane), referred to as "shear" stress. Existing techniques falter because such techniques fail to compensate for the entirety of the stress tensor; that is, they cannot detect all sources of axial and shear stress applied to the gyroscope. In addition, directly measuring stress levels can be useful in sensitive object construction, such as buildings, bridges, or other sensitive sensor systems.

The following techniques address these issues by determining each axial and shear component of an applied stress tensor. In general, the embodiments described below utilize the anisotropic properties of materials (e.g., silicon) to measure the stress or strain applied to the anisotropic material along various axes. More particularly, such embodiments include a piezo-resistive gauge circuit comprising multiple groups of piezo-resistive elements oriented in a multiple rosette structure. Each group of piezo-resistive elements can be further oriented in a fixed or released configuration relative to a substrate. Configuring the piezo-resistive gauge circuit in a multiple rosette structure enables the measurement of both axial and shear stress components. Additionally, orienting the piezo-resistive elements in both released and fixed configurations enables for a more robust MEMS device capable of compensating for both mechanical stress and temperature changes in a system or environment.

Referring to the Figures, FIG. 1 is a top-level diagram of a piezo-resistive gauge circuit. Piezo-resistive gauge circuit 100 includes three circuits electrically coupled together. Each circuit includes a plurality of piezo-resistive elements, configured to produce a resistance based on the level of stress or strain applied to the piezo-resistive elements, known as the "piezo-resistive effect". Piezo-resistive elements such as piezo-resistors exhibit a change in resistance as the piezo-resistive elements experience changes in stress/strain, thereby impacting the resistivity of the piezo-resistive gauge circuit. Piezo-resistive gauge circuit 100 can be placed in any MEMS device, for example, a MEMS gyroscope, accelerometer, or other sensor.

As indicated in FIG. 1, piezo-resistive gauge circuit 100 comprises multiple circuits of piezo-resistive elements which are oriented in a multiple rosette structure. In one embodiment, piezo-resistive elements 102a-d constitute a first circuit. Likewise, a second circuit includes piezo-resistive elements 104a-d and is electrically coupled with the first circuit to form a double rosette structure. This double rosette structure is complemented by a third circuit fashioned in a rosette structure, which includes the piezo-resistive elements 106a-d. Together the three circuits form a triple rosette structure. For pedagogical purposes the resistance of each piezo-resistive element is assumed to be equal; however, varying resistances are also within the scope of this disclosure. Piezo-resistive gauge circuit 100 is formed or fabricated on an anisotropic crystal 101, for example, a monocrystalline or polycrystalline silicon crystal. The anisotropic properties of the silicon crystal in a standard rosette configuration of piezo-resistive elements enables the shear and axial differences of the applied stress tensor to be determined, but not the direct components of stress applied in the axial directions. However, the multiple rosette structure achieved by the present disclosure enables a determination of the stress tensor including direct axial and shear components in a thermally-compensated fashion, as will be described in further detail below.

Also indicated by FIG. 1, piezo-resistive gauge circuit 100 is allowed to move relative to the S and S' coordinate systems based on the stress that is applied to the circuit. For example, piezo-resistive gauge circuit 100 can be rotated by an angle, α (defined as the angle of rotation of piezo-resistive gauge circuit 100 with respect to the vertical axis of coordinate system S), to reach an alternative angular configuration of piezo-resistive gauge circuit, indicated by the dashed box of piezo-resistive gauge circuit 100'. Likewise, each piezo-resistive element can be rotated at an angle β about the S' coordinate system, where β is defined as the angle of rotation of a piezo-resistive element relative to the vertical of coordinate system S', in which β is not equal to α. In other words, β corresponds to the in-plane rotation of the third circuit with respect to first and second circuits. Thus, each piezo-resistive element in piezo-resistive gauge circuit 100 is oriented in an angular configuration, as shown by the layout of piezo-resistive elements 102, 104, and 106, as described in further detail below. "Angular configuration" as used herein means the angle formed (e.g., α and/or β) by a piezo-resistive element relative to a crystallographic axis or another piezo-resistive element (e.g., orthogonal to).

The multiple rosette configuration of piezo-resistive gauge circuit 100 enables the determination of stress or strain that is applied in both the axial and shear directions. To measure the axial stress, the piezo-resistive elements of the first and second circuits of the double rosette structure are configured in a designated angular configuration. Axial stress, such as stress applied purely in the x and y axes of a Cartesian coordinate system, is expressed herein as "xx" and "yy", or alternatively as [100] and [010], respectively. First, the piezo-resistive elements in the first circuit are configured in a first angular configuration with respect to S'. In an exemplary embodiment, the piezo-resistive elements can have an angular configuration of 90-0 degrees rotated by α with respect to S, which coincides with the crystallographic axes. To put more simply, the piezo-resistive elements can be in an orthogonal or substantially orthogonal (e.g., ±20 degrees) configuration. However, other angles are possible.

Similarly, the piezo-resistive elements in the second circuit can also be oriented in an orthogonal or substantially orthogonal configuration, as shown in FIG. 1 (though other angular configurations are possible). The angular configuration of e.g., the first circuit visually depicts what is known as a "rosette" structure. The second circuit is likewise configured as a rosette structure. The coupling of the rosette structures of the first and second circuits enables the formation of a "double rosette" structure. Such a configuration allows differences in mechanical stress applied in an axial dimension (the [100] or [010] axes) to be determined without reconfiguring the piezo-resistive elements.

As described above, the third circuit is oriented in a standard rosette structure distinct from the double rosette orientation of the first and second circuits. In an embodiment, the third circuit is oriented in a 135-45 degree angular configuration rotated by alpha with respect to the S coordinate system. That is, each group of piezo-resistive elements in the third circuit is oriented 135 or 45 degrees rotated by alpha relative to S. However, the third circuit in the standard rosette structure can also be oriented in any kind of angular configuration distinct from that of the first and second circuits. Orienting the third circuit in a distinct configuration enables the determination of shear mechanical stress that is applied (e.g., stress applied in the [110] (xy) plane). By combining all three configurations, both axial and shear stress components of a stress tensor can be determined. Since stress applied in the z axis is (assumed to be) negligible compared to the axial and shear stress in the x and y axes, piezoelectric gauge circuit 100 enables the determination of all stress tensor components.

Depending on the circuit in piezo-resistive gauge circuit 100, groups of piezo-resistive elements can be oriented in a fixed and/or released configuration relative to a substrate coupled to the circuit. In other words, each piezo-resistive element in the group is coupled to a substrate in either a "fixed" or "released" (alternatively, "suspended") fashion, while a group of piezo-resistive elements can include one or more elements in a fixed or released configurations, or some of both. As used herein, the term "fixed" means an element that is wholly or substantially affixed to a substrate. In contrast, the term "released" or "suspended" means at least a substantial portion of the element is separated from the substrate. In some embodiments, the piezo-resistive elements are configured in a snake-like or u-shaped configuration. Additionally, or alternatively, the length of the piezoresistive element along the principal axis is significantly larger than the length in the perpendicular axis.

Figure 2A:
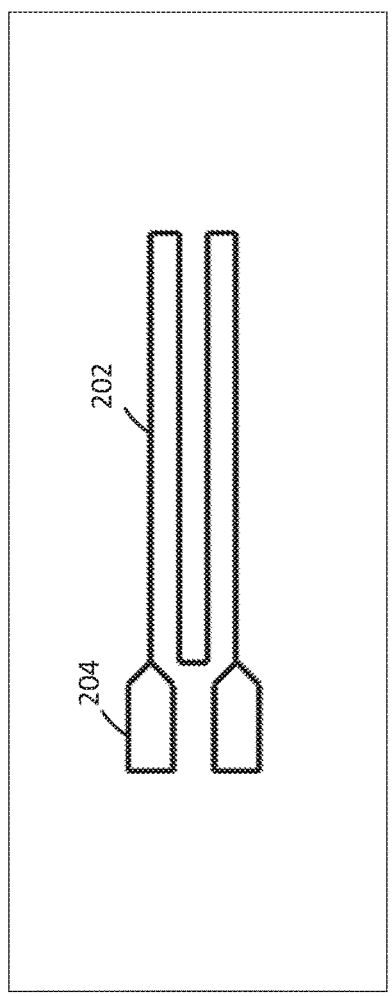
FIG. 2A is a top-level diagram of a piezo-resistive element, according to one or more embodiments described in the present disclosure.
Figure 2C:
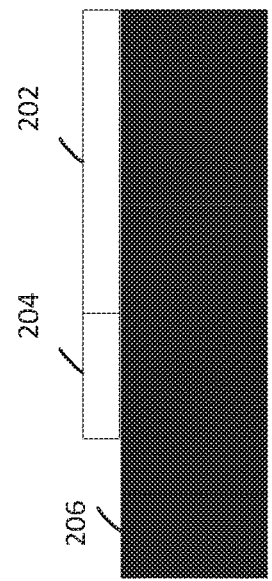
FIGS. 2B and 2C are side-level diagrams of a piezo-resistive element coupled to a substrate in a released/suspended and fixed configuration, respectively, according to one or more embodiments described in the present disclosure.
Figure 2B:
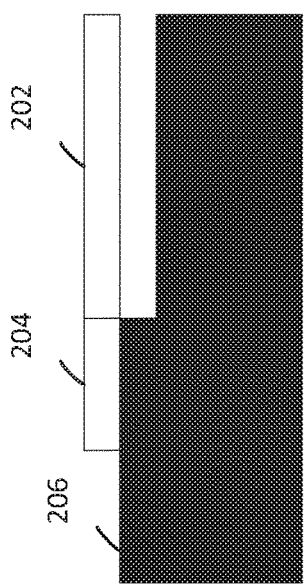

FIGS. 2A-2C illustrate the differences between fixed and released piezo-resistive elements. FIG. 2A depicts a top-level diagram of an exemplary piezo-resistive element, while FIGS. 2B and 2C depict side-level diagrams of a piezo-resistive element 202 coupled to a substrate in a released and fixed configuration, respectively. A piezo-resistive element 202 may be coupled to a substrate (not shown in FIG. 2A) by one or more pads 204. As illustrated in FIGS. 2A-2C, a piezo-resistive element 202 may include segments oriented in a 'u-shaped' structure. Substrate 206 generally can include any type of material for which electrical components may be placed, integrated, or otherwise secured, such as a printed circuit board or chip. Substrate 206 can further include a doped material (e.g., a Silicon substrate) and may optionally comprise two or more distinct substrates. In an exemplary embodiment, one substrate can be an n-doped material for which the double rosette configuration of the first and second circuits may be placed, while the single rosette configuration of the third circuit can be placed on a second, p-doped substrate (or vice-versa, depending on the crystallographic arrangement of the substrate).

One or more piezo-resistive elements in a group may be released relative to the substrate, which is shown in FIG. 2B. In such a case, piezo-resistive element 202 is coupled to the substrate 206 via pads 204 but otherwise is not affixed to substrate 206. Piezo-resistive element 202 exhibits additional degrees of freedom to move as stress or strain is applied. As a result, piezo-resistive element 202 is insensitive to mechanical stress but remains sensitive to changes in temperature. In contrast, the piezo-resistive element 202 exhibited in FIG. 2C remains fixed to substrate 206, for example, by being at least partially embedded in substrate 206. Here, piezo-resistive element 202 is sensitive to both stress/strain and temperature changes.

Ideally, a MEMS device should experience zero or negligible temperature fluctuation in its operating environment. However, in the likely case that the temperature differential substantially affects the resistivity of the device, temperature differences can be compensated by orienting the rosette structures in a Wheatstone bridge circuit configuration, of which one example is illustrated with respect to FIG. 3.

Circuit 300 includes four piezo-resistive element groups R1-R4, which, in various aspects, generally correspond to each of the piezo-resistive elements of circuits one, two, and three described in FIG. 1. For instance, piezo-resistive element group 302 (R1) corresponds to piezo-resistive element 102a, piezo-resistive element group 304 (R2) corresponds to piezo-resistive element 102b, and so on. However, each piezo-resistive element group (e.g., 302) can comprise one or more piezo-resistors. Each circuit 300 may be oriented in a rosette structure as described with respect to FIG. 1.

Figure 3:
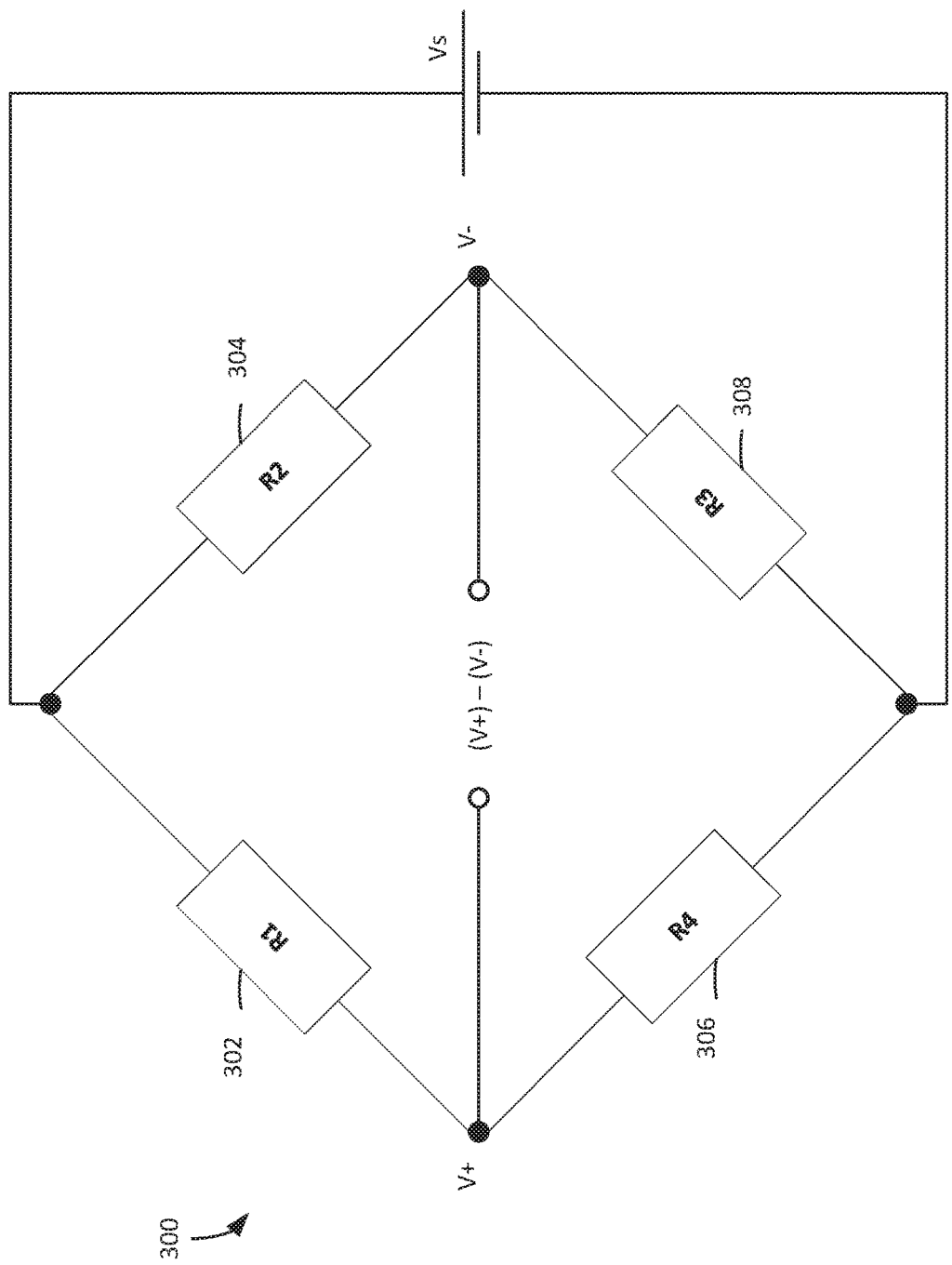
FIG. 3 is a diagram of a Wheatstone bridge circuit comprising piezo-resistive elements of a piezo-resistive gauge circuit, according to one or more embodiments described in the present disclosure.

The principles of a Wheatstone bridge are known to one having ordinary skill but will be briefly described for reference. Referring to FIG. 3, the output voltage, $V_{out}$, can be determined based on the following equation:

$$V_{out} = V_{in}\left(\frac{R_4}{R_1 + R_4} - \frac{R_3}{R_2 + R_3}\right) \qquad \text{Equation 1}$$

where $V_{out}$ and $V_{in}$ output and input voltage from the Wheatstone bridge circuit (alternatively labelled (V+−V−) and Vs, respectively, in FIG. 3). For example, in a 90-0-90-0 angular configuration, (e.g., where R1=R90, R2=R0, R3=R90, and R4=R0)), Equation 1 can be modified as follows:

$$V_{out} = V_{in} \frac{R_0 - R_{90}}{R_0 + R_{90}} \quad \text{Equation 2}$$

Assuming (for ease of explanation) that α=0, the piezo-resistance is proportional to both the piezo-resistivity, π, and the applied stress, σ. Thus, the relationship between $V_{out}$ and these variables can be expressed as:

$$V_{out} \propto V_{in}(\sigma_{11} - \sigma_{22})(\pi_{11} - \pi_{22}) \quad \text{Equation 3}$$

where $\sigma_{11}$ and $\pi_{11}$ is the applied stress and piezo-resistivity in the x direction, while $\sigma_{22}$ and $\pi_{22}$ are analogous quantities in the y direction.

Generally, fixed piezo-resistive elements configured in a standard rosette can only determine the differences between axial components of a stress tensor ($\pi_{11} - \sigma_{22}$), but not $\sigma_{11}$ or $\sigma_{22}$ themselves (as shown by Equation 3). However, combining fixed and released piezo-resistive elements can enable the direct determinations of these quantities. Specifically, by combining the fixed coupling configuration of a standard rosette structure with a rosette structure comprising both fixed and released elements to form a double rosette structure, the output voltage of the respective Wheatstone bridge circuits becomes:

$$V_{fixed} \propto \sigma_{11} - \sigma_{22} \quad \text{Equation 4a}$$

$$V_{fixed/released} \propto \sigma_{11}(\pi) + \sigma_{22}g(\pi) \quad \text{Equation 4b}$$

where α is assumed to be zero, and f(π) and g(π) are functions of the piezoresistive coefficients. Thus, by solving the set of Equations 4a-b, the direct stress components $\sigma_{11}$ and $\sigma_{22}$ can be acquired.

To determine the shear stress component $\sigma_{12}$, a third rosette (third circuit) is introduced coupled to the double rosettes (first and second circuits) at an angular configuration distinct from those of the double rosettes. Thereby, the following relationships depict the acquisition of all stress tensor components (assuming α=0):

$$V_{first} \propto \frac{\sigma_{11}\pi_{11} + \sigma_{22}\pi_{22}}{2} \quad \text{Equation 5a}$$

$$V_{second} \propto \frac{(\sigma_{11} - \sigma_{22})(\pi_{11} - \pi_{22})}{2} \quad \text{Equation 5b}$$

$$V_{third} \propto \sigma_{12}\pi_{12} \quad \text{Equation 5c}$$

where $V_{first}$, $V_{second}$, and $V_{third}$ are the output voltages of each of the first, second, and third circuits respectively. These equations can be solved using conventional techniques.

Referring back to FIG. 3, each group R1-R4 comprises piezo-resistive elements that are oriented either in a fixed or released coupling configuration. For example, piezo-resistive element groups R1 and R3 may be fixed, while piezo-resistive element groups R2 and R4 are released. Other configurations are possible depending on the circuit. Referring to the circuits above, the first circuit can include at least one group of piezo-resistive elements that is fixed and at least one group that is suspended relative to one or more substrates. In one embodiment, the first circuit includes one group of fixed piezo-resistive elements (e.g., R1) and three groups of released piezo-resistive elements (e.g., R2-R4). In another embodiment, the first circuit includes two groups of fixed piezo-resistive elements (e.g., R1 and R3) and two groups of released piezo-resistive elements (e.g., R2 and R4). In any of these embodiments, the piezo-resistive elements in one group of first circuit 300 are orthogonally arranged with respect to another group of piezo-resistive elements, otherwise referred to as a 90-0-90-0 configuration. As a non-limiting example, the first circuit can include two fixed piezo-resistive elements arranged in a 90-90 configuration and two released piezo-resistive elements arranged in a 0-0 configuration.

In another embodiment of circuit 300, each of the groups of piezo-resistive elements are fixed relative to a substrate, for example, when circuit 300 includes the second circuit described above. In this case, each of the fixed groups of piezo-resistive elements are arranged orthogonally (90-0-90-0) relative to the other groups in second circuit 300. The second circuit and the first circuit can be coupled together in a double rosette structure, in which case axial stress components (e.g., in the [100] and [010] axes) can be measured.

In yet another embodiment of circuit 300 (such as the third circuit described above), at least one of the groups of piezo-resistive elements are fixed with respect to a substrate. For example, two groups, three groups, or each of the groups of piezo-resistive resistive elements can be fixed with the remaining groups (if any) being released. In one embodiment, each of the groups are fixed to a substrate. Additionally, in this embodiment, the groups of piezo-resistive elements in third circuit 300 are arranged in a configuration that is different that the piezo-resistive elements in the first and second circuits. For example, the groups in the third circuit can be arranged in a 135-45-135-45 angular configuration in which each piezo-resistance element is oriented either 135 or 45 degrees with respect to the S coordinate system in FIG. 1. However, other angular configurations are also possible, so long as the piezo-resistive elements in the third circuit are oriented at an angle different from the first and second circuits. Including a third circuit in this fashion enables the determination of shear strain (e.g., in the [110] axis). Therefore, by combining the double rosette structure of the first and second circuits with the rosette structure of the third circuit, measurements can be acquired that permit the determination of a stress tensor.

Figure 4:
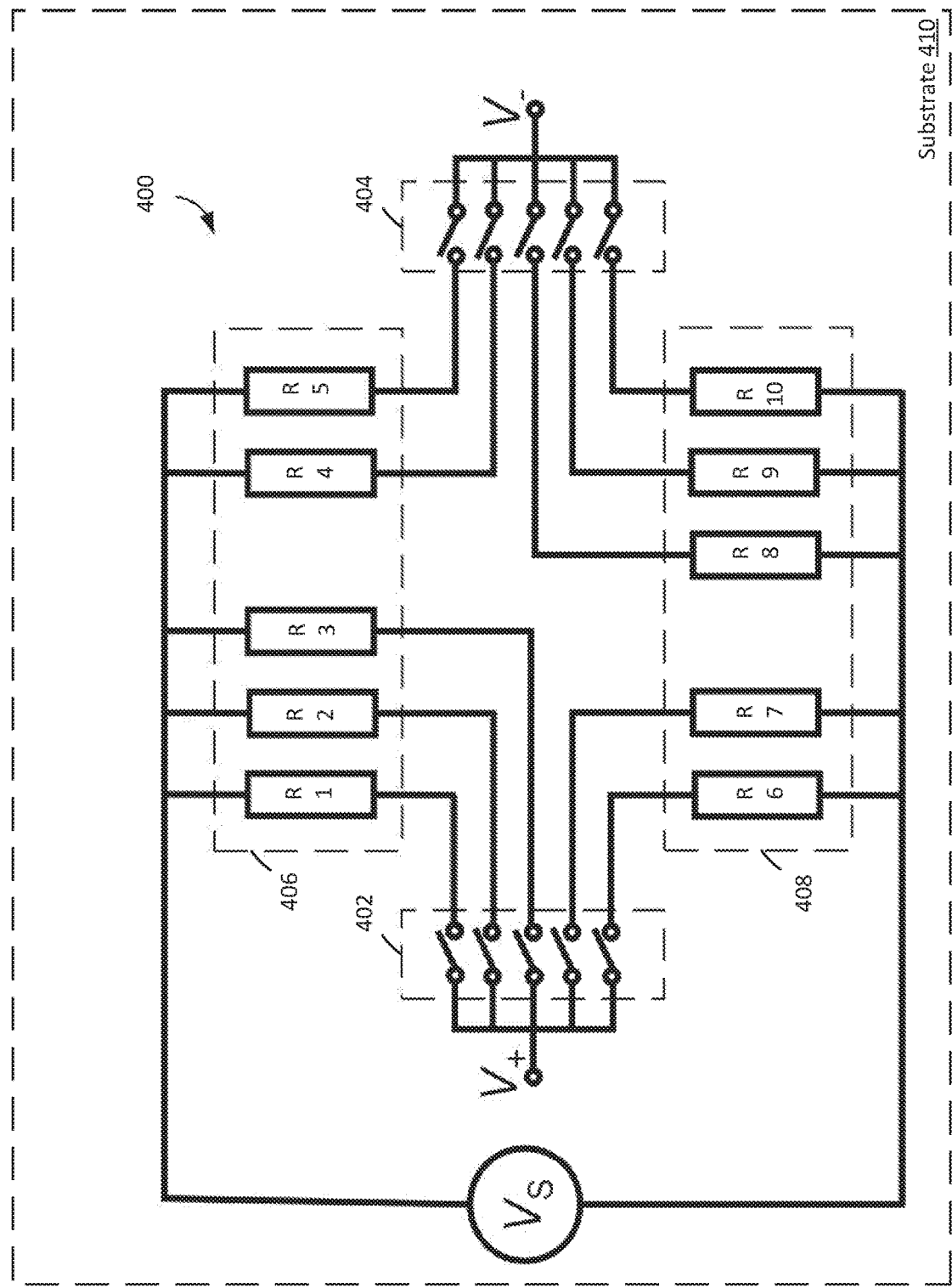
FIG. 4 is a diagram of a piezo-resistive gauge circuit, according to one or more embodiments described in the present disclosure.

FIG. 4 illustrates a block diagram of an exemplary Wheatstone bridge circuit 400 embodying the principles described in FIGS. 1-3. Circuit 400 is coupled to substrate 410 in either a fixed or released fashion as described in FIG. 2. Circuit 400 further includes a voltage source, Vs, switch arrays 402 and 404, and piezo-resistive element groups 406 and 408 comprising a plurality of piezo-resistive elements R1-R10 (R1-R5 in group 406 and R6-R10 in group 408). Each piezoresistive element R1-R10 in groups 406 and 408 can form the basis for a Wheatstone bridge configuration of the first, second, and third circuits. Piezo-resistive elements R1-R10 can be selected using switch arrays 402 and 404 to outputs V+ and V−.

Piezo-resistive elements R1-R10 may be configured in a released or fixed configuration as described above. Additionally, each piezo-resistive element is further oriented in an angular configuration relative to the crystallographic axes of substrate 410, which for pedagogical purposes is defined as the α and β angles described with respect to FIG. 1. For example, in an embodiment, groups 406 and 408 include the following configuration:

| Piezo-resistive Element | Coupling Configuration | Angular Configuration (degrees) |
| --- | --- | --- |
| R1 | Fixed | α + β + 90 |
| R2 | Fixed | α + 90 |
| R3 | Released | α + 90 |
| R4 | Fixed | α |
| R5 | Fixed | α + β |

-continued

| Piezo-resistive Element | Coupling Configuration | Angular Configuration (degrees) |
|---|---|---|
| R6 | Fixed | $\alpha + \beta$ |
| R7 | Fixed | $\alpha$ |
| R8 | Released | $\alpha + 90$ |
| R9 | Fixed | $\alpha + 90$ |
| R10 | Fixed | $\alpha + \beta + 90$ |

However, other such coupling and angular configurations are possible.

When piezo-resistive elements R1-R10 experience stress, the voltage applied in a Wheatstone bridge circuit that includes the affected piezoresistive elements can change positively (V+) or negatively (V−) in relation to a reference voltage (Vs). To transmit the electrical signal changes for further processing, switch arrays 402 and 404 can be configured to selectively configure which piezo-resistive elements will transmit at a given time. For example, switch arrays 402 and 404 can be configured to activate signal pathways for piezo-resistive elements of the first circuit, followed by switching to signal pathways for the piezo-resistive elements of the second circuit, and so on for the third circuit, so that measurement for each of the first, second, and third circuits are received for a given time interval. One or more processors or microprocessors can be coupled to switch arrays 402 and 404 for controlling the read-out sequence of switch arrays 402 and 404, and processing the data received by the first, second, and third circuits via switch arrays 402 and 404 (e.g., processing system 510).

Figure 5:
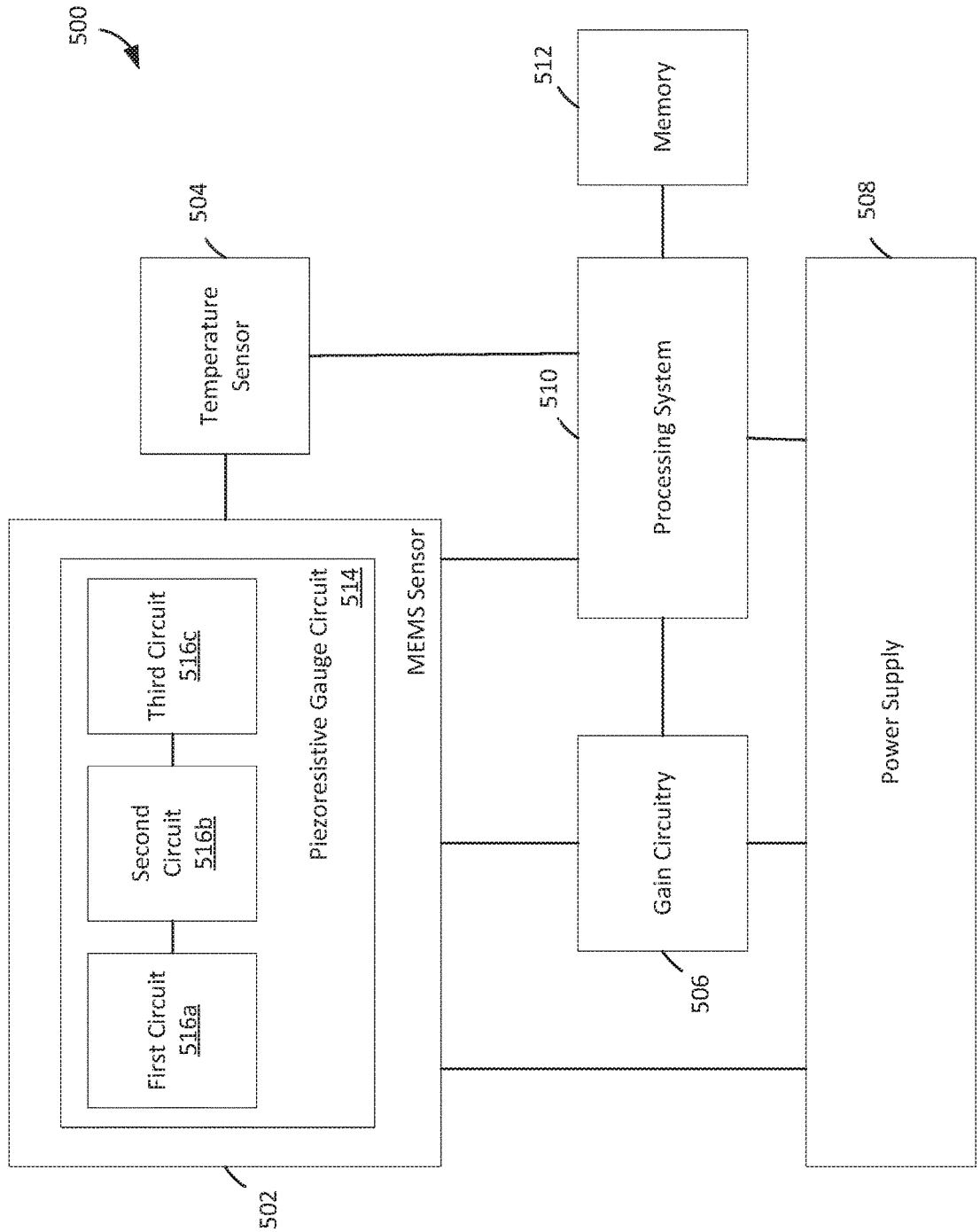
FIG. 5 is a block diagram of a system configured to determine a mechanical stress tensor, according to one or more embodiments described in the present disclosure.

FIG. 5 illustrates a system 500 configured to determine a stress tensor applied to a MEMS sensor. System 500 includes MEMS sensor 502, which further includes piezo-resistive gauge circuit 514. Piezo-resistive gauge circuit 514 may further include the first circuit 516a, second circuit 516b, and third circuit 516c, as described above, coupled to one or more substrates (not shown in FIG. 5). MEMS sensor 502 can function as a gyroscope, accelerometer, or other MEMS device configured to determine inertial or navigation-based measurements for a vehicle; as such, system 500 can be implemented on an aircraft or other moving vehicle or object. In other applications, system 500 can be implemented to measure stress levels in other objects, including buildings, bridges, or other edifices or sensitive sensor systems.

When piezo-resistive gauge circuit 514 detects an external pressure perturbation due to mechanical stress, piezo-resistive gauge circuit 514 can output a change in voltage based on the magnitude of the applied stress. Furthermore, the layout of piezo-resistive elements (that is, the coupling and angular configurations) can be used to determine the stress tensor that is applied to MEMS sensor 502. In an embodiment, processing system 510 can send a command signal to MEMS sensor 502 to activate particular piezo-resistive elements in the first, second, and third circuits of piezo-resistive gauge circuit 514, for example, via switch arrays 402 and 404, so that the orientation and configuration of piezo-resistive elements in piezo-resistive gauge circuit 514 are known and controllable.

System 500 further includes power supply 508 coupled to at least one of MEMS sensor 502, gain circuitry 506, and processing system 510. Power supply 508 comprises circuitry configured to provide a source of power to these system components, and may also provide a reference power level to first circuit 516a, second circuit 516b, and third circuit 516c to compare against voltage shifts due to external temperature and/or mechanical changes. In one embodiment, power supply 508 can provide a +/−12 VDC power and a +/−5V reference voltage.

The signals sent by MEMS sensor 502 in response to applied stress are sent to one or more processors, processing circuitry, or processing systems to be further analyzed and converted into, e.g. navigation and/or inertial data, generically represented in system 500 by processing system 510. Processing system 510 may include any one or combination of processors, microprocessors, digital signal processors, application specific integrated circuits, field programmable gate arrays, and/or other similar variants thereof. Processing system 510 may also include, or function with, software programs, firmware, or other computer readable instructions for carrying out various process tasks, calculations, and control functions, used in the methods described below. These instructions are typically tangibly embodied on any storage media (or computer readable media) used for storage of computer readable instructions or data structures. Processing system 510 can use the signals received by MEMS sensor 502 to determine a stress tensor applied to MEMS sensor 502. Processing system 510 can then send to one or more additional systems (not shown in FIG. 5) onboard a vehicle, including a flight management system (to inform the pilot/operator of stress measurements), and/or a navigation system (to generate navigation parameters based on the stress measurements), and/or to a parent system depending on the particular application.

Additionally, processing system 510 can be coupled to a memory 512. Memory 512 can include any available storage media (or computer readable medium) that can be accessed by a general purpose or special purpose computer or processor, or any programmable logic device. Suitable computer readable media may include storage or memory media such as semiconductor, magnetic, and/or optical media, and may be embodied as storing instructions in non-transitory computer readable media, such as random access memory (RAM), read-only memory (ROM), non-volatile RAM, electrically-erasable programmable ROM, flash memory, or other storage media. The memory may also include one or more databases to store acquired data, such as measurements determined by processing system 510.

In some embodiments, system 500 can include gain circuitry 506 coupled to MEMS sensor 502 and processing system 510. When included, gain circuitry 506 is configured to receive raw signals from MEMS sensor 502 and adjust the gain of the signals for further processing. For example, gain circuitry can include a lock-in amplifier or other amplifier to amplify the gain of the received signals to a desired voltage level. Gain circuitry 506 may additionally include other filters configured to remove excess noise and stabilize received signals. System 500 may optionally include a separate temperature sensor 504 configured to measure temperature of an environment proximate to, or distinct from, that of MEMS sensor 502.

Figure 6:
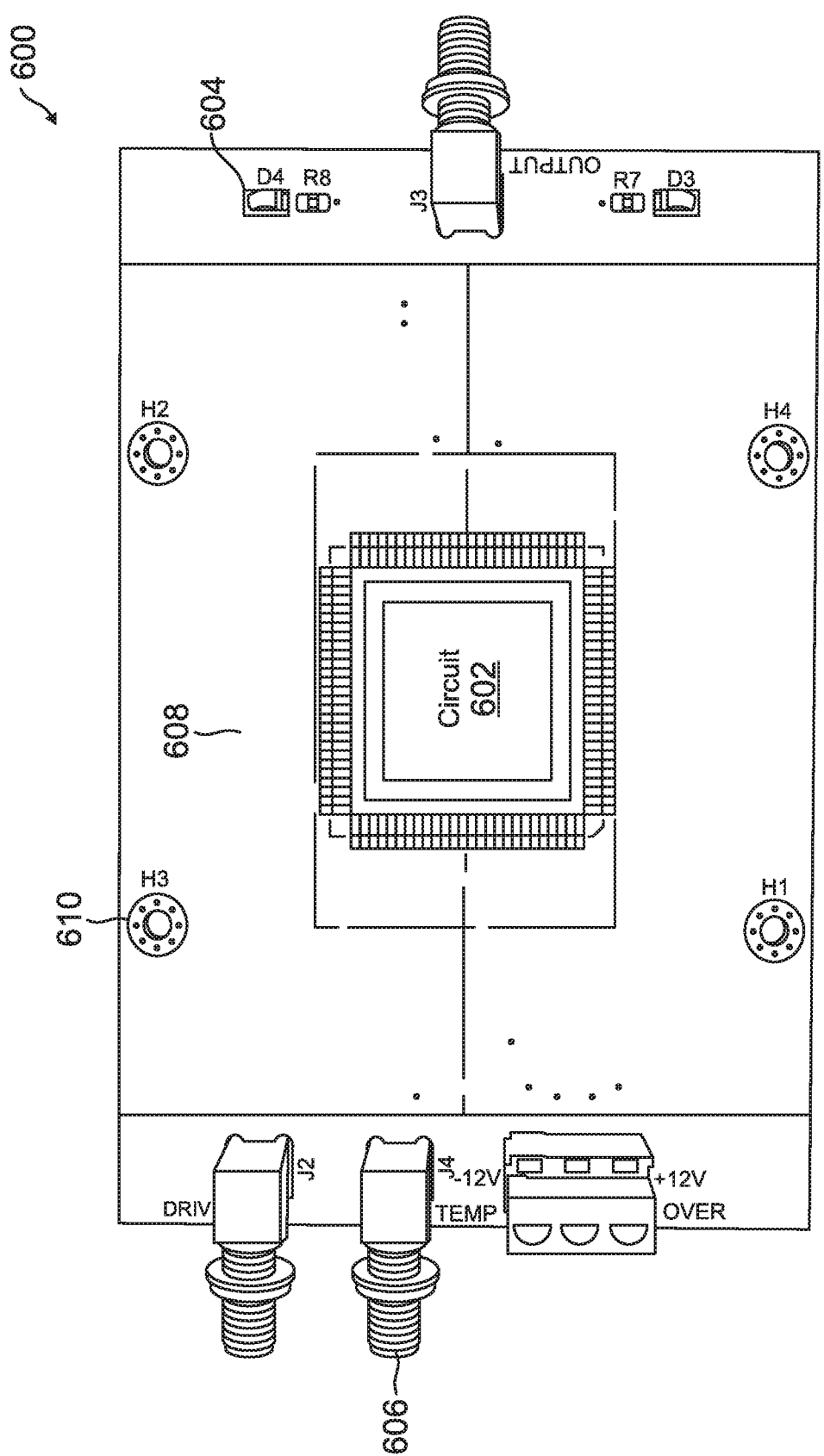
FIG. 6 is a top-level diagram of a device including a piezo-resistive gauge circuit configured to measure components of a mechanical stress tensor, according to one or more embodiments described in the present disclosure.

Referring to FIG. 6, a top-level illustration of a MEMS device 600 including a piezo-resistive gauge circuit 602 configured to determine an applied mechanical stress tensor is shown. As described above, piezo-resistive gauge circuit 602 can be placed on one or more substrates. The one or more substrates can be coupled to (e.g., embedded on or in) a printed circuit board 608, which may be fastened or secured by one or more nuts or screws 610. Additionally, printed circuit board 608 may include additional electronics, such as indicator 604 (for example, an LED indicating a connected power supply is on) and those described with respect to FIG. 5, embedded on or in the board. Device 600 further includes one or more connectors 606 for connecting to one or more devices or systems.

Figure 7:
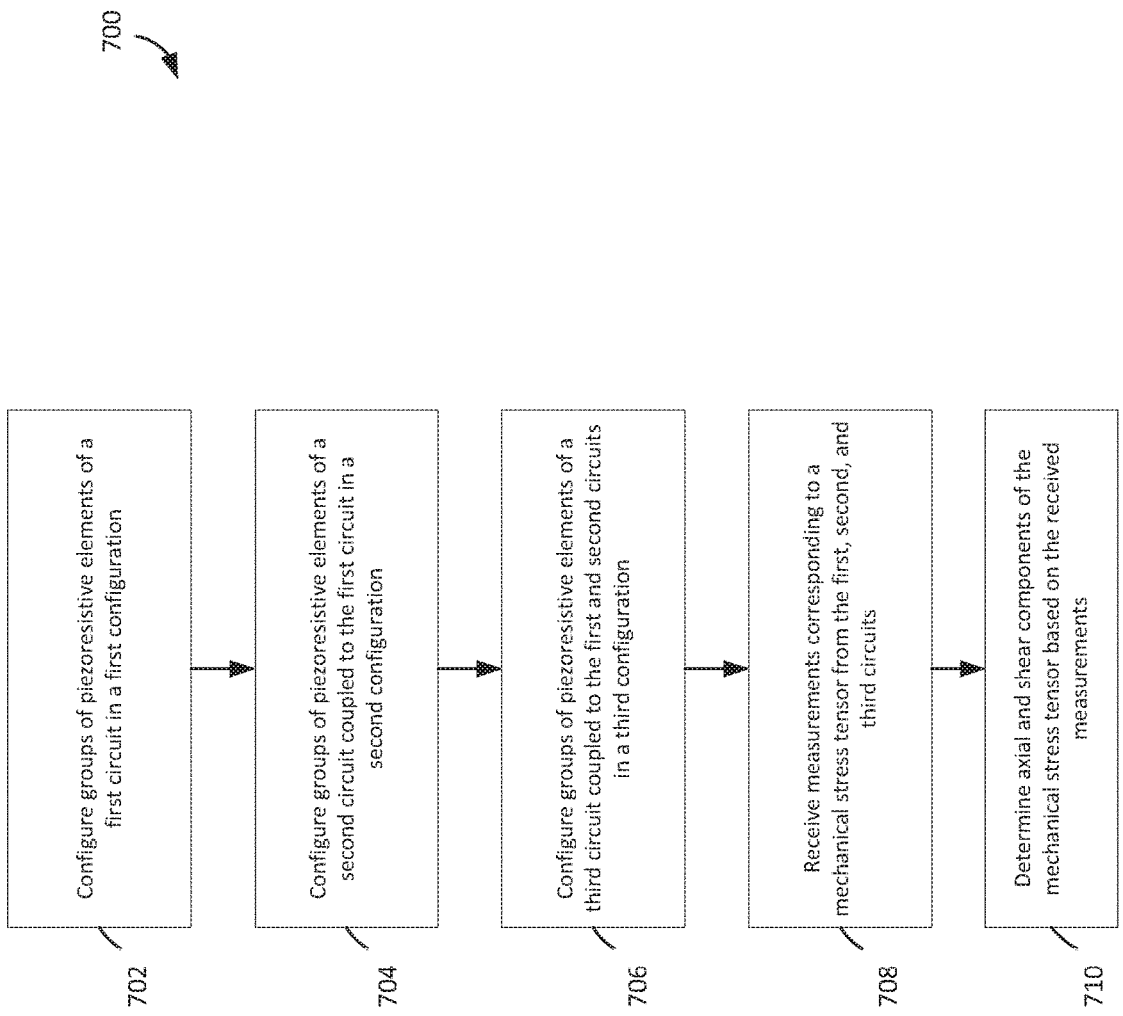
FIG. 7 is a flow chart of a method for determining an applied mechanical stress tensor, according to one or more embodiments described in the present disclosure.

FIG. 7 is a flow chart of a method for determining a mechanical stress tensor via a MEMS device. Method 700 may be implemented via the techniques described with respect to FIGS. 1-7, but may be implemented via other techniques as well. The blocks of the flow diagram have been arranged in a generally sequential manner for ease of explanation; however, it is to be understood that this arrangement is merely exemplary, and it should be recognized that the processing associated with the methods described herein (and the blocks shown in the Figures) may occur in a different order (for example, where at least some of the processing associated with the blocks is performed in parallel and/or in an event-driven manner).

Method 700 begins at block 702 by configuring groups of piezo-resistive elements of a first circuit in a first configuration. The first configuration can comprise at least one piezo-resistive element that is released from a substrate. In some embodiments, the first configuration can comprise at least one piezo-resistive element that is fixed to a substrate.

The first configuration further comprises each piezo-resistive element in the first and second groups oriented in an angle, a, respective to the crystallographic axes of the one or more substrates coupled to the piezo-resistive elements, wherein the first and second groups are oriented in a rosette structure. In an embodiment, the first and second groups are oriented orthogonally or substantially orthogonal. Similarly, the third and fourth group of a second circuit are oriented in an angle α and are oriented orthogonally or substantially orthogonal.

Method 700 proceeds to block 704 by configuring a third and fourth group of piezo-resistive elements of a second circuit in a second configuration. The second configuration comprises each of the piezo-resistive elements in the third and fourth groups fixed with respect to a substrate. The second configuration further comprises each of the piezo-resistive elements oriented in a rosette structure with respect to the piezo-resistive elements of the first circuit. In an embodiment, the second configuration includes the piezo-resistive elements of the second circuit oriented orthogonally or substantially orthogonal. The second circuit also couples the first circuit to form a double rosette structure.

Method 700 advances to block 706 by configuring a fifth and sixth group of piezo-resistive elements of a third circuit in a third configuration. The third configuration can comprise at least one piezo-resistive element fixed with respect to a substrate. In an embodiment, the third configuration comprises each piezo-resistive element fixed to one or more substrates. The third configuration comprises each of the piezo-resistive elements oriented at an angle distinct from the groups in the first and second circuits. In one embodiment, the third configuration comprises the fifth and sixth group of piezo-resistive elements oriented in a 45-135-45-135 in-plane angular configuration relative to the first and second configurations. The third circuit complementary couples the double rosette structure of the first and second circuits in a third standard rosette structure.

Once the circuits are configured properly, method 700 proceeds to block 708 by receiving measurements from the first, second, and third circuits. The measurements correspond to mechanical stress from a stress tensor applied to the MEMS device.

Method 700 proceeds at block 710 by determining the axial and shear components of the mechanical stress tensor based on the received measurements. Due to the configuration of the first, second, and third circuits, a mechanical stress tensor can be determined, as opposed to a partial or relative stress tensor based on the differences between axial stress components.

The methods and techniques described herein may be implemented in digital electronic circuitry, or with a programmable processor (for example, a special-purpose processor or a general-purpose processor such as a computer) firmware, software, or in various combinations of each. Apparatus embodying these techniques may include appropriate input and output devices, a programmable processor, and a storage medium tangibly embodying program instructions for execution by the programmable processor. A process embodying these techniques may be performed by a programmable processor executing a program of instructions to perform desired functions by operating on input data and generating appropriate output. The techniques may advantageously be implemented in one or more programs that are executable on a programmable system including at least one programmable processor coupled to receive data and instructions from, and to transmit data and instruction to, a data storage system, at least one input device, and at least one output device. Generally, a processor will receive instructions and data from a read-only memory and/or a random-access memory. Storage devices suitable for tangibly embodying computer program instructions and data include all forma of non-volatile memory, including by way of example semiconductor memory devices, such as EPROM, EEPROM, and flash memory devices; magnetic disks such as internal hard disks and removable disks; magneto-optical disks; and DVD disks. Any of the foregoing may be supplemented by, or incorporated in, specially-designed ASICs.

The terms "about" or "substantially" mean that the value or parameter specified may be somewhat altered, as long as the alteration does not result in nonconformance of the process or structure to the illustrated embodiment from the perspective of one having ordinary skill in the art. For instance, unless otherwise indicated, a numerical quantity modified by the term "substantially" can be altered to within ±20% of the specified value. Finally, the term "exemplary" merely indicates the accompanying description is used as an example, rather than implying an ideal, essential, or preferable feature of the invention.

Terms of relative position as used in this application are defined based on a plane parallel to, or in the case of the term coplanar—the same plane as, the conventional plane or working surface of a device, layer, wafer, or substrate, regardless of orientation. The term "horizontal" or "lateral" as used in this application are defined as a plane parallel to the conventional plane or working surface of a device, layer, wafer, or substrate, regardless of orientation. The term "vertical" refers to a direction perpendicular to the horizontal. Terms such as "on," "side" (as in "sidewall"), "higher," "lower," "over," "top," and "under" are defined with respect to the conventional plane or working surface being on the top surface of a device, layer, wafer, or substrate, regardless of orientation. The term "coplanar" as used in this application is defined as a plane in the same plane as the conventional plane or working surface of a device, layer, wafer, or substrate, regardless of orientation.

EXAMPLE EMBODIMENTS

Example 1 includes a device, comprising: a first circuit comprising a first group and a second group of piezo-resistive elements oriented in a first configuration, wherein the first group and second group comprise at least one piezo-resistive element that is fixed to at least one substrate and at least one piezo-resistive element suspended from the at least one substrate; a second circuit coupled to the first circuit comprising a third and fourth group of piezo-resistive elements oriented in a second configuration, wherein each piezo-resistive element in the third and fourth group is fixed to the at least one substrate; and a third circuit coupled to the first and second circuits, wherein the third circuit comprises a fifth and sixth group of piezo-resistive elements oriented in a third configuration distinct from the first and second configuration, wherein at least one of the piezo-resistive elements in the fifth and sixth groups are fixed to the at least one substrate.

Example 2 includes the device of Example 1, wherein the third configuration comprises each of the piezo-resistive elements oriented at an angle different than an angle of the piezo-resistive elements in the first and second configurations.

Example 3 includes the device of any of Examples 1-2, wherein the third configuration comprises the fifth and sixth groups of piezo-resistive elements oriented at a 45-135-45-135 in-plane angular configuration relative to the first and second configurations.

Example 4 includes the device of any of Examples 1-3, wherein the first and second group comprises two piezo-resistive elements that are fixed and two piezo-resistive elements that are released from the at least one substrate.

Example 5 includes the device of any of Examples 1-4, wherein the fifth and sixth group comprises each piezo-resistive element fixed to the at least one substrate.

Example 6 includes the device of any of Examples 1-5, wherein the first configuration comprises the first and second groups of piezo-resistive elements oriented at a 90-0-90-0 degree configuration with respect to a crystallographic axis of the at least one substrate, and wherein the second configuration comprises the third and fourth groups of piezo-resistive elements oriented at a 90-0-90-0 degree configuration with the to a crystallographic axis of the at least one substrate.

Example 7 includes the device of any of Examples 1-6, wherein each of the piezo-resistive elements in the second group is arranged substantially orthogonal with respect to the piezo-resistive elements in the first group, and wherein each of the piezo-resistive elements in the fourth group are arranged substantially orthogonal with respect to the piezo-resistive elements in the third group.

Example 8 includes a system, comprising: a micro-electro-mechanical systems (MEMS) device, comprising: a first circuit comprising a first group and a second group of piezo-resistive elements oriented in a first configuration, wherein the first group and second group comprise at least one piezo-resistive element that is fixed to at least one substrate and at least one piezo-resistive element suspended from the at least one substrate; a second circuit coupled to the first circuit comprising a third and fourth group of piezo-resistive elements oriented in a second configuration, wherein each piezo-resistive element in the third and fourth group is fixed to the at least one substrate; and a third circuit coupled to the first and second circuits, wherein the third circuit comprises a fifth and sixth group of piezo-resistive elements oriented in a third configuration distinct from the first and second configuration, wherein at least one of the piezo-resistive elements in the fifth and sixth groups are fixed to the at least one substrate.

Example 9 includes the system of Example 8, further comprising a processing system coupled to the MEMS device, wherein the processing system comprises one or more processors, and wherein the processing system is configured to determine a mechanical stress tensor that is applied to the MEMS device based on measurements received from the MEMS device.

Example 10 includes the system of any of Examples 8-9, wherein the third configuration comprises each of the piezo-resistive elements oriented at an angle different than an angle of the piezo-resistive elements in the first and second configurations.

Example 11 includes the system of any of Examples 8-10, wherein the first and second group comprises two piezo-resistive elements that are fixed and two piezo-resistive elements that are released from the at least one substrate, and wherein the fifth and sixth group comprises each piezo-resistive element fixed to the at least one substrate.

Example 12 includes the system of any of Examples 8-11, wherein the MEMS device further comprises an anisotropic monocrystalline or anisotropic polycrystalline silicon crystal coupled to the first, second, and third circuits.

Example 13 includes the system of any of Examples 9-12, further comprising a power supply coupled to at least one of: the MEMS device, the processing system, and gain circuitry, and wherein the power supply is configured to provide a reference voltage to at least one of: the first, second, and third circuits.

Example 14 includes the system of any of Examples 9-13, further comprising gain circuitry coupled to the MEMS device and the processing system, wherein the gain circuitry is configured to modify a gain of signals received from the MEMS device.

Example 15 includes the system of any of Examples 8-14, wherein each of the piezo-resistive elements in the second group is arranged substantially orthogonal with respect to the piezo-resistive elements in the first group, and wherein each of the piezo-resistive elements in the fourth group are arranged substantially orthogonal with respect to the piezo-resistive elements in the third group.

Example 16 includes a method, comprising: receiving measurements of mechanical stress from a micro-electromechanical device comprising a first, second, and third circuit, wherein: the first circuit comprises a first and second group of piezo-resistive elements in a first configuration, wherein the first configuration comprises at least one piezo-resistive element that is fixed to at least one substrate and at least one piezo-resistive element suspended from the at least one substrate; the second circuit comprises a third and fourth group of piezo-resistive elements in a second configuration, wherein the second configuration comprises each piezo-resistive element in the third and fourth group is fixed to the at least one substrate; the third circuit comprises a fifth and sixth group of piezo-resistive elements in a third configuration, wherein the third configuration comprises each of the piezo-resistive elements oriented at an angle different than an angle of the piezo-resistive elements in the first and second configurations, and wherein the third configuration comprises at least one of the piezo-resistive elements in the fifth and sixth groups are fixed to the at least one substrate; and determining dimensional components of the mechanical stress based on the received measurements.

Example 17 includes the method of Example 16, further comprising orienting the fifth and sixth groups of piezo-resistive elements at a 45-135-45-135 in-plane angular configuration relative to the first and second configurations.

Example 18 includes the method of any of Examples 16-17, wherein the first and second group comprises two piezo-resistive elements that are fixed and two piezo-resistive elements that are released from the at least one substrate, and wherein the fifth and sixth group comprises each piezo-resistive element fixed to the at least one substrate.

Example 19 includes the method of any of Examples 16-18, wherein the first configuration comprises each of the piezo-resistive elements in the second group is arranged substantially orthogonal with respect to the piezo-resistive elements in the first group, and wherein the second configuration comprises each of the piezo-resistive elements in the fourth group are arranged substantially orthogonal with respect to the piezo-resistive elements in the third group.

Example 20 includes the method of any of Examples 16-19, wherein the first configuration comprises the first and second groups of piezo-resistive elements oriented at a 90-0-90-0 degree configuration with respect to a crystallographic axis of the at least one substrate, and wherein the second configuration comprises the third and fourth groups of piezo-resistive elements oriented at a 90-0-90-0 degree configuration with the to a crystallographic axis of the at least one substrate.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A device, comprising:
    a first circuit comprising a first group and a second group of piezo-resistive elements oriented in a first configuration, wherein the first group and second group comprise at least one piezo-resistive element that is fixed to at least one substrate and at least one piezo-resistive element suspended from the at least one substrate;
    a second circuit coupled to the first circuit comprising a third and fourth group of piezo-resistive elements oriented in a second configuration, wherein each piezo-resistive element in the third and fourth group is fixed to the at least one substrate; and
    a third circuit coupled to the first and second circuits, wherein the third circuit comprises a fifth and sixth group of piezo-resistive elements oriented in a third configuration distinct from the first and second configuration, wherein at least one of the piezo-resistive elements in the fifth and sixth groups are fixed to the at least one substrate,
    wherein the first, second, and third configurations are concentric about an axis normal to the at least one substrate.

2. The device of claim 1, wherein the third configuration comprises each of the piezo-resistive elements oriented at an angle different than an angle of the piezo-resistive elements in the first and second configurations.

3. The device of claim 1, wherein the third configuration comprises the fifth and sixth groups of piezo-resistive elements oriented at a 45-135-45-135 in-plane angular configuration relative to the first and second configurations.

4. The device of claim 1, wherein the first and second group comprises two piezo-resistive elements that are fixed and two piezo-resistive elements that are released from the at least one substrate.

5. The device of claim 1, wherein the fifth and sixth group comprises each piezo-resistive element fixed to the at least one substrate.

6. The device of claim 1, wherein the first configuration comprises the first and second groups of piezo-resistive elements oriented at a 90-0-90-0 degree configuration with respect to a crystallographic axis of the at least one substrate, and wherein the second configuration comprises the third and fourth groups of piezo-resistive elements oriented at a 90-0-90-0 degree configuration with respect to a crystallographic axis of the at least one substrate.

7. The device of claim 1, wherein each of the piezo-resistive elements in the second group is arranged substantially orthogonal with respect to the piezo-resistive elements in the first group, and wherein each of the piezo-resistive elements in the fourth group are arranged substantially orthogonal with respect to the piezo-resistive elements in the third group.

8. A system, comprising:
    a micro-electro-mechanical systems (MEMS) device, comprising:
        a first circuit comprising a first group and a second group of piezo-resistive elements oriented in a first configuration, wherein the first group and second group comprise at least one piezo-resistive element that is fixed to at least one substrate and at least one piezo-resistive element suspended from the at least one substrate;
        a second circuit coupled to the first circuit comprising a third and fourth group of piezo-resistive elements oriented in a second configuration, wherein each piezo-resistive element in the third and fourth group is fixed to the at least one substrate; and
        a third circuit coupled to the first and second circuits, wherein the third circuit comprises a fifth and sixth group of piezo-resistive elements oriented in a third configuration distinct from the first and second configuration, wherein at least one of the piezo-resistive elements in the fifth and sixth groups are fixed to the at least one substrate; and
    a processing system coupled to the MEMS device, wherein the processing system comprises one or more processors, wherein the processing system is configured to determine a coaxial and an axial stress component of a mechanical stress tensor experienced by the MEMS device based on measurements received from the MEMS device.

9. The system of claim 8, wherein the third configuration comprises each of the piezo-resistive elements oriented at an angle different than an angle of the piezo-resistive elements in the first and second configurations.

10. The system of claim 8, wherein the first and second group comprises two piezo-resistive elements that are fixed and two piezo-resistive elements that are released from the at least one substrate, and wherein the fifth and sixth group comprises each piezo-resistive element fixed to the at least one substrate.

11. The system of claim 8, wherein the first, second, and third circuits are formed on an anisotropic monocrystalline or anisotropic polycrystalline silicon crystal.

12. The system of claim 8, further comprising a power supply coupled to at least one of: the MEMS device, the processing system, and gain circuitry, and wherein the power supply is configured to provide a reference voltage to at least one of: the first, second, and third circuits.

13. The system of claim 8, further comprising gain circuitry coupled to the MEMS device and the processing system, wherein the gain circuitry is configured to modify a gain of signals received from the MEMS device.

14. The system of claim 8, wherein each of the piezo-resistive elements in the second group is arranged substantially orthogonal with respect to the piezo-resistive elements in the first group, and wherein each of the piezo-resistive elements in the fourth group are arranged substantially orthogonal with respect to the piezo-resistive elements in the third group.

15. A method, comprising:
receiving measurements of mechanical stress from a micro-electro-mechanical device comprising a first, second, and third circuit, wherein:
the first circuit comprises a first and second group of piezo-resistive elements in a first configuration, wherein the first configuration comprises at least one piezo-resistive element that is fixed to at least one substrate and at least one piezo-resistive element suspended from the at least one substrate;
the second circuit comprises a third and fourth group of piezo-resistive elements in a second configuration, wherein the second configuration comprises each piezo-resistive element in the third and fourth group is fixed to the at least one substrate;
the third circuit comprises a fifth and sixth group of piezo-resistive elements in a third configuration, wherein the third configuration comprises each of the piezo-resistive elements oriented at an angle different than an angle of the piezo-resistive elements in the first and second configurations, and wherein the third configuration comprises at least one of the piezo-resistive elements in the fifth and sixth groups are fixed to the at least one substrate; and
determining an axial and a coaxial component of a mechanical stress tensor experienced by the piezo-resistive elements of the first, second, and third circuits based on the received measurements.

16. The method of claim 15, further comprising orienting the fifth and sixth groups of piezo-resistive elements at a 45-135-45-135 in-plane angular configuration relative to the first and second configurations.

17. The method of claim 15, wherein the first and second group comprises two piezo-resistive elements that are fixed and two piezo-resistive elements that are released from the at least one substrate, and wherein the fifth and sixth group comprises each piezo-resistive element fixed to the at least one substrate.

18. The method of claim 15, wherein the first configuration comprises each of the piezo-resistive elements in the second group is arranged substantially orthogonal with respect to the piezo-resistive elements in the first group, and wherein the second configuration comprises each of the piezo-resistive elements in the fourth group are arranged substantially orthogonal with respect to the piezo-resistive elements in the third group.

19. The method of claim 15, wherein the first configuration comprises the first and second groups of piezo-resistive elements oriented at a 90-0-90-0 degree configuration with respect to a crystallographic axis of the at least one substrate, and wherein the second configuration comprises the third and fourth groups of piezo-resistive elements oriented at a 90-0-90-0 degree configuration with respect to a crystallographic axis of the at least one substrate.

* * * * *